United States Patent [19]

Trontelj

[11] Patent Number: 6,037,763
[45] Date of Patent: Mar. 14, 2000

[54] ELECTRICITY MEASUREMENT APPARATUS USING HALL EFFECT SENSOR HAVING RECTIFIED BIAS CURRENT

[75] Inventor: Janez Trontelj, Liubliana, Slovenia

[73] Assignee: Horstmann Timers & Controls Limited, United Kingdom

[21] Appl. No.: 08/913,500

[22] PCT Filed: Mar. 8, 1996

[86] PCT No.: PCT/GB96/00539

§ 371 Date: Sep. 16, 1997

§ 102(e) Date: Sep. 16, 1997

[87] PCT Pub. No.: WO96/28739

PCT Pub. Date: Sep. 19, 1996

[30] Foreign Application Priority Data

Mar. 16, 1995 [GB] United Kingdom ............... 9505314

[51] Int. Cl.[7] .................. G01R 21/08; G01R 19/00; G01R 33/07

[52] U.S. Cl. .............. 324/117 H; 324/119; 324/142; 324/251

[58] Field of Search ............... 324/117 R, 117 H, 324/119, 126, 127, 142, 251

[56] References Cited

U.S. PATENT DOCUMENTS

| | | | |
|---|---|---|---|
| 5,065,088 | 11/1991 | Habiro et al. | 324/117 H |
| 5,497,077 | 3/1996 | Nukui | 324/117 H |
| 5,554,927 | 9/1996 | Maruyama | 324/117 H |

FOREIGN PATENT DOCUMENTS

| | | |
|---|---|---|
| 0 601 817 | 6/1994 | European Pat. Off. . |
| 1 010 156 | 6/1957 | Germany . |
| 1 209 653 | 1/1966 | Germany . |
| 57-93263 | 6/1982 | Japan . |

OTHER PUBLICATIONS

International Search Report, Int'l Appn. No. PCT/GB96/00539, Int'l Filing Date Aug. 03, 1996, 3 pp.

*Primary Examiner*—Gerard Strecker
*Attorney, Agent, or Firm*—Fish & Richardson P.C.

[57] ABSTRACT

An electricity meter includes a sensor supplied with a rectified A.C. supply signal, the sensor detecting the strength of magnetic field induced by current flow along a conductor and providing an output signal following a sine-squared relation with alternating positive and negative sign in each half cycle, the output signal being filtered to remove a component due to D.C. offset error.

11 Claims, 2 Drawing Sheets

ELECTRICITY MEASUREMENT APPARATUS USING HALL EFFECT SENSOR HAVING RECTIFIED BIAS CURRENT

BACKGROUND OF THE INVENTION

The present invention relates to an electricity measurement apparatus and a method of electricity measurement, in particular for current measurement, power measurement and Watthour metering.

When current flows through a conductor, a rotational magnetic field is set up. The magnitude of this magnetic field is proportional to the density of current flowing:

$$B \alpha I/A \quad \text{(Equation 1)}$$

where I is the total current, and A is the cross sectional area of the conductor. This value I/A is the current density J.

It is known to use sensors, such as Hall effect sensors, to measure current flow though a conductor by detecting the magnetic field. For example, using a Hall effect sensor, the sensor output signal has a voltage, VH, which is proportional to the magnetic field strength B at the sensor, and a bias current IB flowing through the sensor as follows:

$$VH = S \times B \times IB \quad \text{(Equation 2).}$$

The proportionality coefficient S is the sensitivity of the sensor. By keeping constant the current through the Hall sensor, a linear relationship is achieved between the detected magnetic field and output voltage.

If such a sensor is placed near a conductor, the two equations (1) and (2) above can be combined allowing current flow to be determined:

$$VH \alpha J \quad \text{(Equation 3).}$$

Hall sensors produce Direct Current (D.C.) offset errors, which are independent of the direction (positive or negative) with which the bias current IB is applied to the sensor. Conventionally, as shown in FIG. 3, the bias current IB is selected to be proportional to the electricity mains supply voltage. The current IB and detected magnetic field B are both Alternating Current (A.C.) signals which vary according to a sine relation. Accordingly, the output voltage VH follows a sine squared relation where D.C. offsets are components of the resultant VH signal.

Other D.C. offsets can also occur due to the electronic circuits associated with the subsequent processing operations.

The effects of D.C. offsets are minimised conventionally by using large Hall sensors, in particular so called "external" sensors not integrated with other processing circuitry on an integrated circuit such as a silicon chip. The conventional principle applied is that the larger the Hall sensor is, the larger is the Hall voltage which it provides relative to its D.C. offset error.

SUMMARY OF THE INVENTION

The present invention preferably provides an electrical measurement apparatus comprising supply means operative to supply a rectified A.C. supply signal to a sensor, the sensor being operative to detect magnetic field strength due to A.C. current flow alone a conductor and to provide an output signal dependent on detected field strength and the rectified A.C. supply signal, the output signal following a sine-squared relation with alternating positive and negative sign in each half cycle, and filtering means operative to remove a component due to a D.C. offset error from the output signal. The rectified A.C. signal is preferably a rectified A.C. bias current signal. The filtering means preferably comprises a capacitor. The A.C. mains signal is the alternating voltage signal of an electrical supply network to which the conductor is connected.

It will be seen that preferred embodiments of the invention have the advantage that components due to D.C. offset errors are cancelled. This is done in a simple and automatic manner. In consequence, further advantages arise. In particular, sensors can be made sufficiently small that multiple sensors can be integrated on a single silicon chip.

Preferably, the sensor is a Hall sensor and the supply signal to the sensor is a current signal. The supply signal is preferably proportional to the electricity mains supply voltage. The output signal from a sensor is preferably a voltage signal. The A.C. current flow along the conductor is preferably an electricity mains supply current.

The present invention also provides a method of measuring electricity flow alone a conductor including the steps of supplying a rectified A.C. supply signal to a sensor, the sensor detecting magnetic field strength due to A.C. current flow along a conductor and providing an output signal dependent on detected field strength and the rectified A.C. supply signal, the output signal following a sine-squared relation with alternating positive and negative sign in each half cycle, and filtering to remove a component due to D.C. offset error from the output signal.

A preferred embodiment of the present invention will now be described by way of example only with reference to the drawings in which:

DETAILED DESCRIPTION

As described this invention relates to apparatus and a method for eliminating D.C. voltage offset errors in a multiplying circuit used in an energy measurement circuit. The preferred method of energy measurement is based on the alternating current flow to be measured producing an alternating magnetic field B, that field being detected using an electronic circuit containing an Hall effect device. The A.C. voltage to be measured is converted to a Hall bias current IB and applied across the Hall effect device. The resulting Hall voltage VH is proportional to the instantaneous power being conducted.

Figure 1:
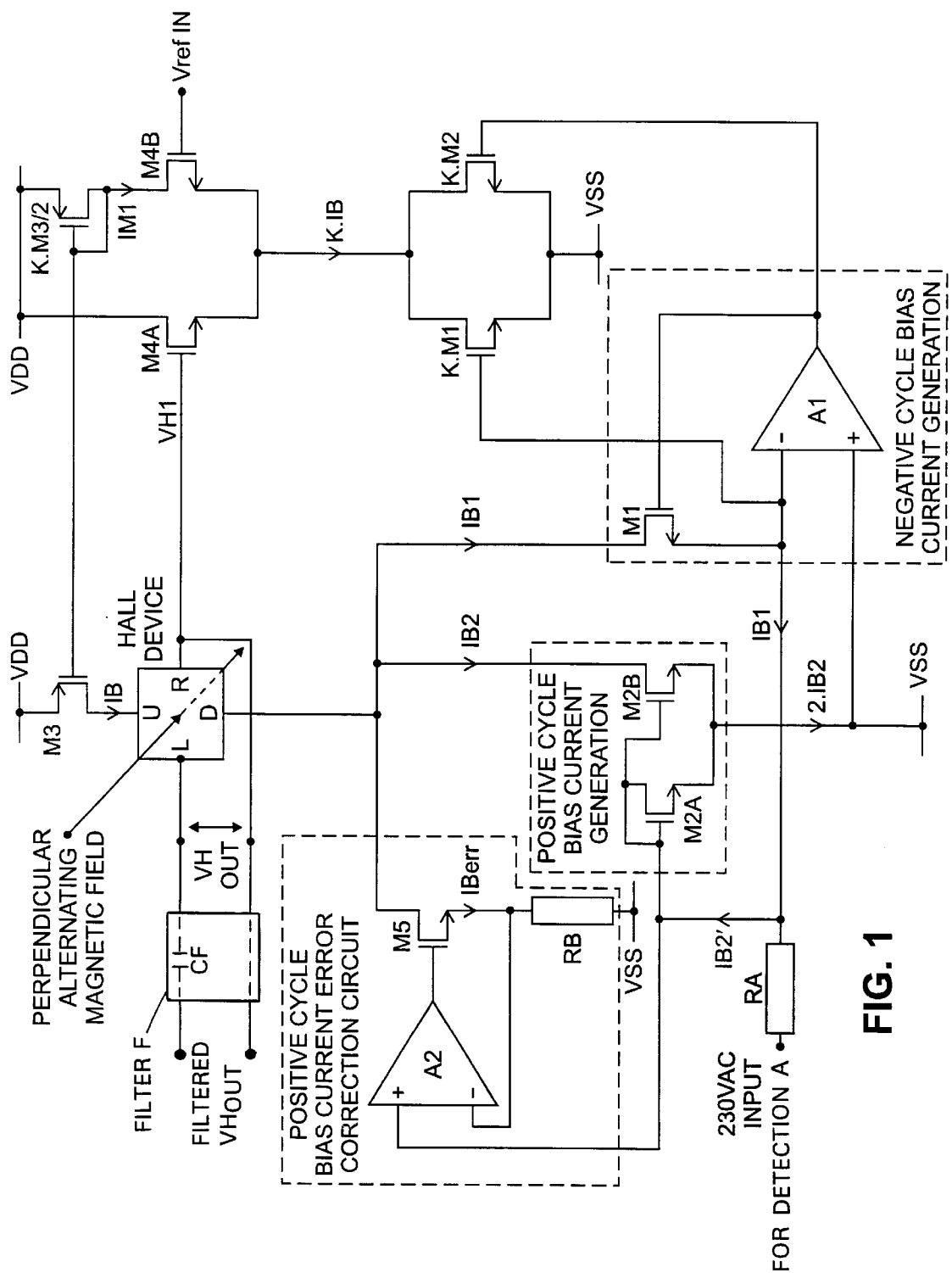
FIG. 1 is a circuit diagram for an embodiment of the invention.
Figure 2:
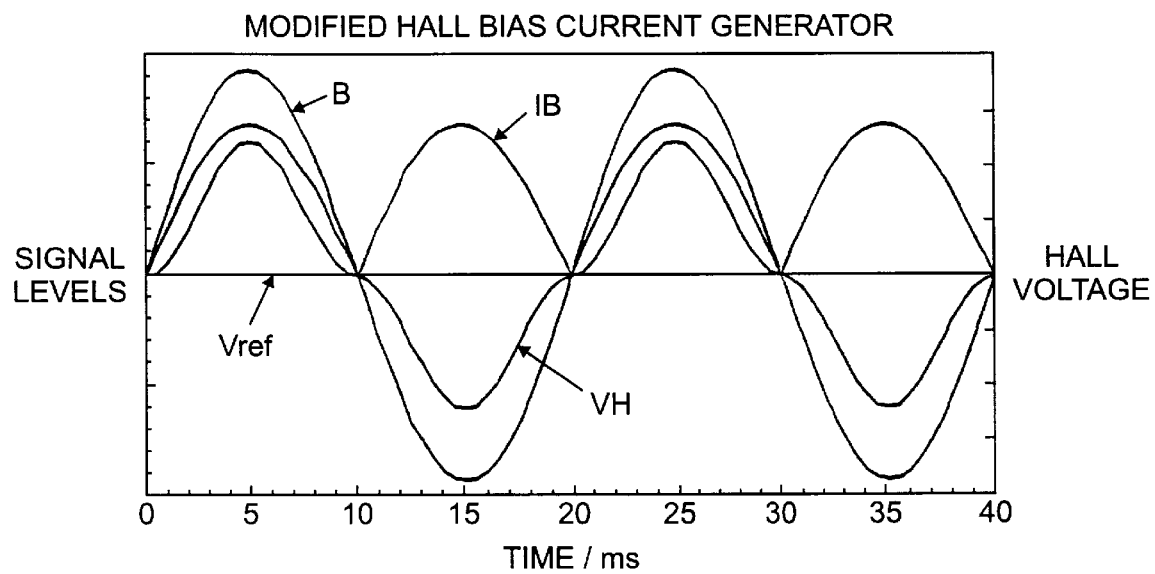
FIG. 2 shows wave forms for supply current and output Hall voltage in a circuit according to the present invention.
Figure 3:
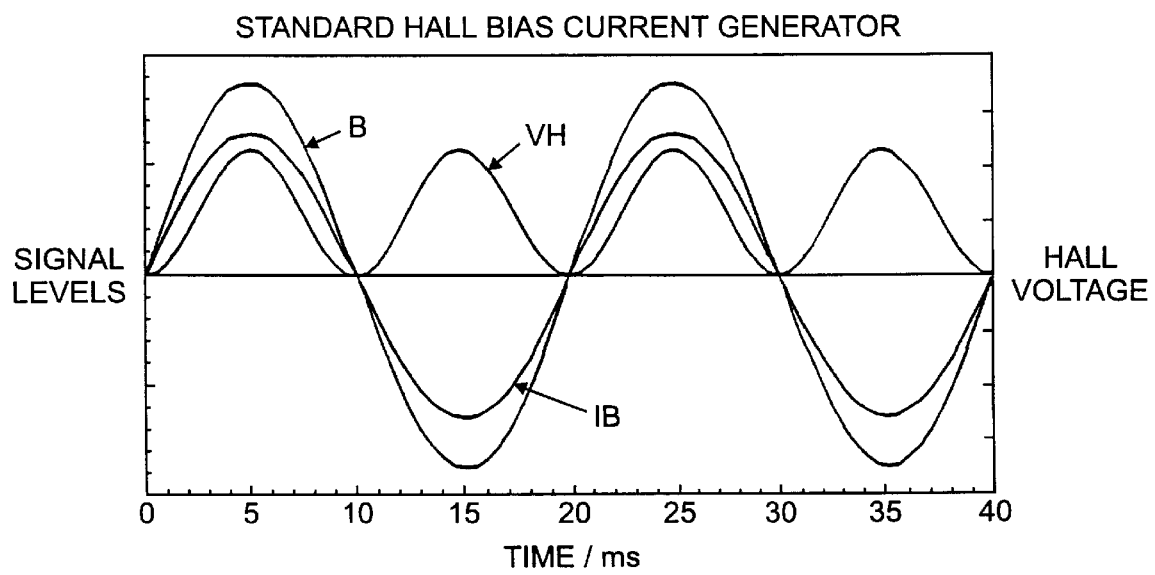
FIG. 3 shows corresponding wave forms to FIG. 2 for a topical known circuit (prior art) for comparison.

FIG. 1 shows a schematic of a circuit capable of producing an instantaneous Hall bias current, IB, of amplitude proportional to the instantaneous A.C. voltage applied to the input port A. The circuit is arranged to produce an instantaneous Hall bias current which is in phase with the applied A.C. voltage during the positive half cycle of the A.C. voltage, and is 180 degrees out of phase with the applied A.C. voltage during the negative half cycle of the applied A.C. voltage. These waveforms are shown on FIG. 2.

When an alternating magnetic field is applied to the Hall effect device in a plane which is perpendicular to the direction of Hall bias current flow, an alternating $Sin^2 \emptyset$ Hall voltage waveform VH is generated by the Hall effect device. This waveform is shown on FIG. 2 and is a piecewise waveform following:

$Sin^2\emptyset$ for positive half cycles
$-Sin^2\emptyset$ for negative half cycles where $\emptyset$ is phase (being representative of time). This waveform can be expressed mathematically as:

| VH = | A $Sin^2\emptyset$ | for $\emptyset$ in the range 0 to $\pi$ |
|---|---|---|
| | $-$A $Sin^2\emptyset$ | for $\emptyset$ in the range $\pi$ to $2\pi$ |

More strictly, this waveform can be expressed as:

| VH = | A $Sin^2\emptyset$ | $\forall\emptyset\epsilon[0,\pi)$ |
|---|---|---|
| | $-$A $Sin^2\emptyset$ | $\forall\emptyset\epsilon[\pi,2\pi)$ | where A is a constant and $\emptyset$ is representative of time following the equation $\emptyset=2\pi ft$, with f being a signal frequency in Hertz and t being time in seconds.

Where the symbols have the following meanings:

$\forall$ means "for all values of".

$\epsilon$ means "is in the range".

'[' means from and including the value stated immediately after the bracket. (The mathematical term is a "closed limit").

')' means up to but not including the value stated immediately before the bracket. (The mathematical term is an "open limit").

Therefore, the expression "$\forall\emptyset\epsilon[0,\pi)$" signifies "for all values of $\emptyset$ in the interval from and including 0 up to but not including $\pi$".

The instantaneous amplitude of this alternating $Sin^2\emptyset$ voltage waveform is proportional to the multiplication of the instantaneous amplitude of the alternating magnetic field B and the Hall bias current IB. Since the Hall bias current IB is proportional to the A.C. voltage applied to the input port A and the alternating magnetic field B is proportional to the alternating current flow through the conductor, the amplitude of the alternating $Sin^2\emptyset$ Hall voltage waveform, VH, is proportional to the instantaneous power flow.

The production of the alternating $Sin^2\emptyset$ Hall voltage waveform VH allows simple elimination of any unwanted D.C. voltages in the circuit by filtering out D.C. voltages using a D.C. blocking capacitor. Unwanted D.C. voltages can occur due to Hall effect device D.C. offsets and amplifier D.C. offsets. D.C. voltages on the Hall voltage VH can also be caused by external D.C. magnetic fields. All of these D.C. voltages are simply removed by using a simple D.C. blocking filter F which includes capacitor CF.

The circuit shown in FIG. 1 also centres the alternating $Sin^2\emptyset$ Hall voltage waveform, VH, on Vref allowing the Hall effect device to be operated in its linear region.

In the circuit VDD is the positive circuit supply voltage typically 5VoltsDC. VSS is the negative circuit supply voltage typically 0VoltsDC and Vref is typically the voltage midpoint between these, typically 2.5VoltsDC.

Detailed Description of Circuit

Referring again to FIG. 1, the approach is to generate a Hall bias current IB proportional to the applied A.C. voltage in two different ways for each of the two half cycles of the A.C. voltage applied to input A.

The A.C. voltage is applied to the input A of resistor RA.

During negative half cycles of the A.C. voltage, applied to input A, the A.C. voltage is converted to Hall bias current IB1 by Resistor RA. Transistor M1 and Amplifier A1 in a conventional fashion.

During the positive half cycle, bias current is created with the same polarity as during the negative half cycle. This is achieved by Resistor RA, and Transistors M2A and M2B. Current IB2' is flowing via transistor M2A in the positive half cycle. The current IB2' is determined by the resistor RA and the transistor M2A voltage drop. A bias current IB2 is generated and flows through transistor M2B which matches the current flowing through RA and transistor M2A. This matching is achieved since transistor M2A and M2B are arranged in what is commonly known as a "current mirror". The current IB2 and IB2' flowing from transistors M2B and M2A respectively are joined and flow to rail VSS. The current flowing to rail VSS is IB2+IB2' and, since IB2 and IB2' are matched by the current mirror, the current flowing to rail VSS is twice IB2. There is a small error in this second half cycle of the A.C. voltage to Hall bias current conversion since transistor M2A fails to operate below around 2VoltsDC. This is compensated for by amplifier A2, transistor M5 and resistor RB which create the bias current IBerr during this inoperative region. The resistance value of resistor RB is essentially the same as the resistance value of resistor RA.

As thus far described, the circuit has created the desired rectified Hall bias current IB. The second half of the circuit using transistors K.M1, K.M2, M4A, M4B, K.M3/2 and M3 is included to centre the Hall voltage VH on Vref. The Hall voltage is maintained such that the midpoint of its amplitude takes the midpoint value between maximum possible Output voltage VDD and minimum possible output voltage VSS of the Hall device. For example the Hall voltage VH is centred on Vref where Vref is 2.5V D.C., where the maximum possible Hall voltage output is 5V and the minimum is 0V. The Hall voltage thus varies around its midpoint output where the response of the Hall device is most linear.

The Hall voltage is centred on Vref by careful control of the current into the Hall device which is controlled by transistor M3. The Hall bias current IB flows through M3 from the supply VDD, through the Hall device and becomes either IB1, IB2 or IBerr. The centre voltage of the Hall device can however be varied by changing the impedance of transistor M3. The input to control this voltage Vref is at M4B. Transistors M4A and M4B are arranged as a Long Tailed Pair ie. with their emitters connected to a current source. The current source is generated by transistors K.M1 and K.M2. This current source is proportional to the Hall bias currents IB1 and IB2 since the same control signals are input to K.M1 and K.M2 as M1 and M2A. Transistors K.M3/2 and M3 are arranged as a "current mirror", with current IM1 flowing through K.M3/2 and being mirrored through M3.

Since these components are interconnected with a feedback loop through the Hall device back to M4A, a description of circuit operation is best given by examples of what happens under certain conditions as described below.

If the voltage VH1 at the gate of M4A is equal to Vref on the gate of M4B then equal currents will flow through M4A and M4B. The currents through M4A and M4B are controlled by K.M1 and K.M2 and are equal to K.IB at all time as described earlier. Hence K.IB/2 flows through M4A and M4B respectively. It follows that K.IB/2 flows through K.M3/2. Sine K.M3/2 and M3 are arranged as a "current mirror", the current K.IB/2 is mirrored across to M3 with a gain in magnitude of 2/K. Therefore current IB flows in M3 exactly as needed to keep equilibrium.

If the voltage VH1 at the gate of M4A is lower than Vref, less current will flow through M4A than M4B. Since the total current through M4A and M4B must be K.IB, transistor K.M3/2 will conduct more than K.IB/2. Therefore M3 will try to conduct more than IB. This leads to an increase in voltage on the R contact of the Hall device until VH1 equals Vref.

If the voltage VH1 at the gate of M4A is higher than Vref, more current will flow through M4A than M4B. Since the total current through M4A and M4B must be K.IB, transistor K.M3/2 will conduct less than K.IB/2. Therefore M3 will try to conduct less than IB. This leads to a decrease in voltage on the R contact of the Hall device until VH1 equals Vref.

Hence it is shown that the second desired factor of holding the Hall device centred on Vref is achieved by the second half of the circuit.

The factor K is typically 1/10 which helps reduce the overall current consumption of the circuit.

I claim:

1. An electricity measurement apparatus comprising:

a supply device operating on an A.C. supply signal to provide a rectified A.C. supply signal for supply to a sensor, the sensor being operative to detect magnetic field strength due to current flow along a conductor supplied with the A.C. supply signal and to provide an output signal dependent on detected field strength and the rectified A.C. supply signal, the output signal following a sine-squared relation having an alternating positive and negative sign in each half cycle of its waveform, a filter operative to remove a component due to a D.C. offset error from the output signal, and circuitry operating on the sensor output signal to maintain its amplitude midpoint at least approximately at a reference signal level midway between minimum and maximum possible amplitudes of the output signal.

2. An electricity measurement apparatus according to claim 1, in which the rectified A.C. signal is a rectified A.C. current signal.

3. An electricity measurement apparatus according to claim 1, in which the filter comprises a capacitor.

4. An electricity measurement apparatus according to claim 1, in which components due to D.C. offset errors cancel.

5. An electricity measurement apparatus according to claim 1, in which the sensor is a Hall sensor.

6. An electricity measurement apparatus according to claim 1, in which the rectified A.C. supply signal to the sensor is proportional to the electricity mains supply voltage.

7. An electricity measurement apparatus according to claim 1, in which the output signal from a sensor is a voltage signal.

8. An electricity measurement apparatus according to claim 1, in which the A.C. electricity flowing along the conductor is an electricity mains supply current.

9. A method of measuring electricity flow along a conductor supplied with an A.C. supply signal comprising:

rectifying the A.C. supply signal, supplying the rectified A.C. supply signal to a sensor, the sensor detecting magnetic field strength due to current flow along a conductor supplied with the A.C. supply signal and providing an output signal dependent on detected field strength and the rectified A.C. supply signal, the output signal following a sine-squared relation with alternating positive and negative sign in each half cycle of its waveform, maintaining the sensor output signal amplitude midpoint at least approximately at a reference signal level midway between minimum and maximum possible amplitudes of the output signal, and filtering the output signal to remove a component due to D.C. offset error.

10. A method according to claim 9, in which the filtering is undertaken by a capacitor.

11. A method according to claim 9, in which the sensor is a Hall effect device.

* * * * *